United States Patent
Tseng et al.

(10) Patent No.: US 10,243,075 B2
(45) Date of Patent: Mar. 26, 2019

(54) JUNCTION FET SEMICONDUCTOR DEVICE WITH DUMMY MASK STRUCTURES FOR IMPROVED DIMENSION CONTROL AND METHOD FOR FORMING THE SAME

(71) Applicant: Taiwan Semiconductor Manufacturing Co., Ltd., Hsinchu (TW)

(72) Inventors: Hua-Chou Tseng, Hsin-Chu (TW); Han-Chung Lin, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/802,846

(22) Filed: Nov. 3, 2017

(65) Prior Publication Data

US 2018/0053850 A1    Feb. 22, 2018

Related U.S. Application Data

(60) Continuation of application No. 14/881,006, filed on Oct. 12, 2015, now Pat. No. 9,818,866, which is a division of application No. 13/861,523, filed on Apr. 12, 2013, now Pat. No. 9,196,751.

(60) Provisional application No. 61/781,955, filed on Mar. 14, 2013.

(51) Int. Cl.
| | |
|---|---|
| *H01L 29/66* | (2006.01) |
| *H01L 29/78* | (2006.01) |
| *H01L 29/808* | (2006.01) |
| *H01L 27/088* | (2006.01) |
| *H01L 27/098* | (2006.01) |
| *H01L 21/266* | (2006.01) |
| *H01L 29/06* | (2006.01) |

(Continued)

(52) U.S. Cl.
CPC ........ *H01L 29/7832* (2013.01); *H01L 21/266* (2013.01); *H01L 27/088* (2013.01); *H01L 27/098* (2013.01); *H01L 29/0692* (2013.01); *H01L 29/0847* (2013.01); *H01L 29/42364* (2013.01); *H01L 29/665* (2013.01); *H01L 29/66484* (2013.01); *H01L 29/66545* (2013.01); *H01L 29/66901* (2013.01); *H01L 29/808* (2013.01)

(58) Field of Classification Search
CPC ............. H01L 27/098; H01L 27/14679; H01L 29/66893; H01L 29/66916; H01L 29/1066; H01L 29/7392; H01L 29/80; H01L 29/808; H01L 29/8086
See application file for complete search history.

(56) References Cited

U.S. PATENT DOCUMENTS

| | | |
|---|---|---|
| 1,745,175 A | 1/1930 | Lilienfeld |
| 7,973,344 B2 | 7/2011 | Banna |
| 2007/0045727 A1 | 3/2007 | Shiraishi |

(Continued)

*Primary Examiner* — Jae Lee
(74) *Attorney, Agent, or Firm* — Duane Morris LLP (57) ABSTRACT

A method for semiconductor devices on a substrate includes using gate structures which serve as active gate structures in a MOSFET region, as dummy gate structures in a JFET region of the device. The dummy gate electrodes are used as masks and determine the spacing between gate regions and source/drain regions, the width of the gate regions, and the spacing between adjacent gate regions according to some embodiments, thereby forming an accurately dimensioned transistor channel.

20 Claims, 10 Drawing Sheets

(51) Int. Cl.
*H01L 29/08* (2006.01)
*H01L 29/423* (2006.01)

(56) References Cited

U.S. PATENT DOCUMENTS

| | | | |
|---|---|---|---|
| 2008/0180974 A1* | 7/2008 | Shiraishi | H01L 27/0922 363/24 |
| 2008/0272406 A1 | 11/2008 | Banna | |
| 2011/0193161 A1 | 8/2011 | Zhu | |
| 2012/0223763 A1 | 9/2012 | Sawada | |
| 2012/0273798 A1 | 11/2012 | Alptekin et al. | |
| 2013/0075820 A1 | 3/2013 | Scheiper et al. | |
| 2013/0082285 A1 | 4/2013 | Kudou | |
| 2013/0207188 A1 | 8/2013 | Ervin et al. | |
| 2014/0051240 A1 | 2/2014 | Choi et al. | |

\* cited by examiner

FIG. 10

JUNCTION FET SEMICONDUCTOR DEVICE WITH DUMMY MASK STRUCTURES FOR IMPROVED DIMENSION CONTROL AND METHOD FOR FORMING THE SAME

RELATED APPLICATION

This is Continuation Application of U.S. patent application Ser. No. 14/881,006, filed on Oct. 12, 2015, which is a Divisional Application of U.S. patent application Ser. No. 13/861,523, filed on Apr. 12, 2013, which claims priority to U.S. provisional patent application Ser. No. 61/781,955 filed Mar. 14, 2013, the contents of which are incorporated by reference herein in their entireties.

TECHNICAL FIELD

The disclosure relates, most generally, to semiconductor devices and methods for manufacturing the same. The disclosure relates, more particularly, to JFET and MOSFET devices and methods for forming JFET and MOSFET devices with self-aligned features and superior dimension control.

BACKGROUND

A junction field effect transistor (JFET, also known as junction gate field effect transistor) is a semiconductor transistor formed in a semiconductor substrate and the current that flows in a JFET is controlled by electrodes made of P-N junctions formed in the semiconductor substrate. The gate electrode is one such P-N junction formed in the semiconductor substrate. Gate voltage is applied to a transistor channel across the P-N junction of the gate electrode and this controls the current going from source to drain. To turn off the transistor by pinching off the current flow, the gate-to-source voltage is controlled. To pinch off current in an N-channel JFET, a negative gate-to-source voltage is applied and to pinch off current flow in a P-channel JFET, a positive gate-to-source voltage is applied.

Junction field effect transistors have relatively long channels compared to MOSFET (Metal Oxide Semiconductor Field Effect Transistor) devices. In JFET transistors, the source and drain regions are not immediately adjacent the gate region or separated from the gate region by an LDD (lightly doped drain) region. Rather, the gate region in the substrate is separated from the source and drain regions also formed in the substrate. The transistor channel is a current path from the source to the drain as activated by the gate and therefore it is especially critical to position the source, drain and gate regions accurately so that they are accurately spaced apart by the desired spacing and a desired channel length is achieved.

The source and drain and gate regions are typically formed by separate patterning and ion implantation operations that introduce dopant impurities into the substrate and the separate patterning operations each carry with them a degree of alignment and placement inaccuracy. Any inaccuracy impacts the channel length which is designed in conjunction with the voltage to be applied to the gate. Therefore, if the gate is not spaced accurately from the source and the drain resulting in an undesired channel length, the transistor will not function properly using the desired voltage.

It is therefore desirable to produce transistors such as JFET's that have accurately aligned and carefully spaced features.

BRIEF DESCRIPTION OF THE DRAWING

The present disclosure is best understood from the following detailed description when read in conjunction with the accompanying drawing. It is emphasized that, according to common practice, the various features of the drawing are not necessarily to scale. On the contrary, the dimensions of the various features may be arbitrarily expanded or reduced for clarity. Like numerals denote like features throughout the specification and drawing.

DETAILED DESCRIPTION

The disclosure provides for forming various types of JFET (junction gate field effect or junction field effect transistor) devices. The JFET transistors are formed using a sequence of processing operations that simultaneously form other devices such as MOSFET (metal oxide semiconductor field effect transistor) devices and other semiconductor devices on other regions of the same substrate. According to one embodiment, gate structures are formed over the substrate in both JFET and MOSFET regions and the gate structures serve as active transistor gates for the MOSFET devices and serve as dummy gates in the JFET region. In the JFET region, the dummy gates accurately establish the spacing between the gate region and the source/drain regions and therefore the transistor channel length and other structures serve as the actual transistor gates.

Figure 1:
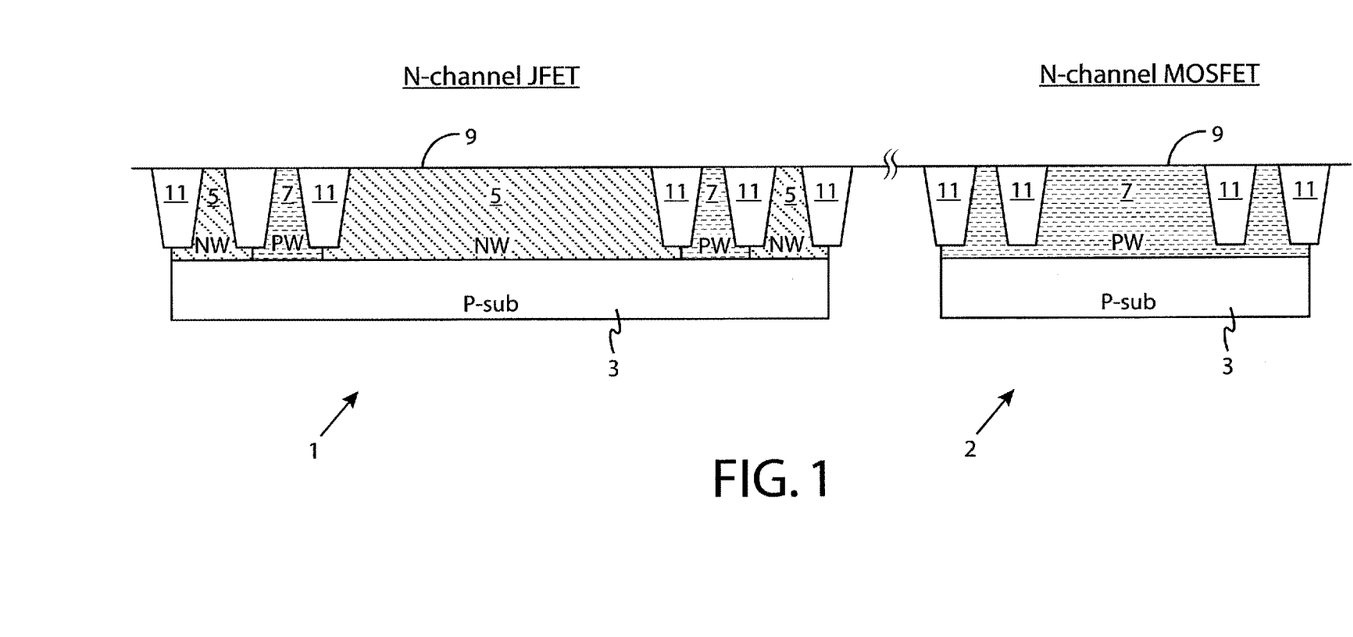
FIGS. 1-6 are cross-sectional views showing a sequence of processing operations according to an embodiment of the disclosure.

FIG. 1 shows two substrate portions: N-channel JFET portion 1 and N-channel MOSFET portion 2. Both N-channel JFET portion 1 and N-channel MOSFET portion 2 are formed in the same substrate, P-type substrate 3 as indicated by substrate surface 9 and the breakaway lines. In some embodiments, both N-channel JFET portion 1 and N-channel MOSFET portion 2 form parts of an integrated circuit device formed on the substrate. In other embodiments, P-channel JFET devices and P-channel MOSFET devices are formed in various dopant regions in a substrate including in a single integrated circuit or other semiconductor device. N-channel JFET portion 1 and N-channel MOSFET portion 2 are formed in the same substrate which is subjected to the sequence of processing operations that simultaneously form features of N-channel JFET portion 1 and N-channel MOSFET portion 2. In FIG. 1, N-channel JFET portion 1 and N-channel MOSFET portion 2 each include N-wells 5 and P-wells 7 formed in P-type substrate 3. STI structures (shallow trench isolation structures) 11 extend downwardly from substrate surface 9.

Although the disclosure is described in conjunction with the illustrated N-channel JFET portion 1 and N-channel MOSFET portion 2, aspects of the disclosure are also used to form P-channel JFET devices and P-channel MOSFET devices in other embodiments. In such other embodiments, the polarity of the various well portions will differ.

Figure 2:
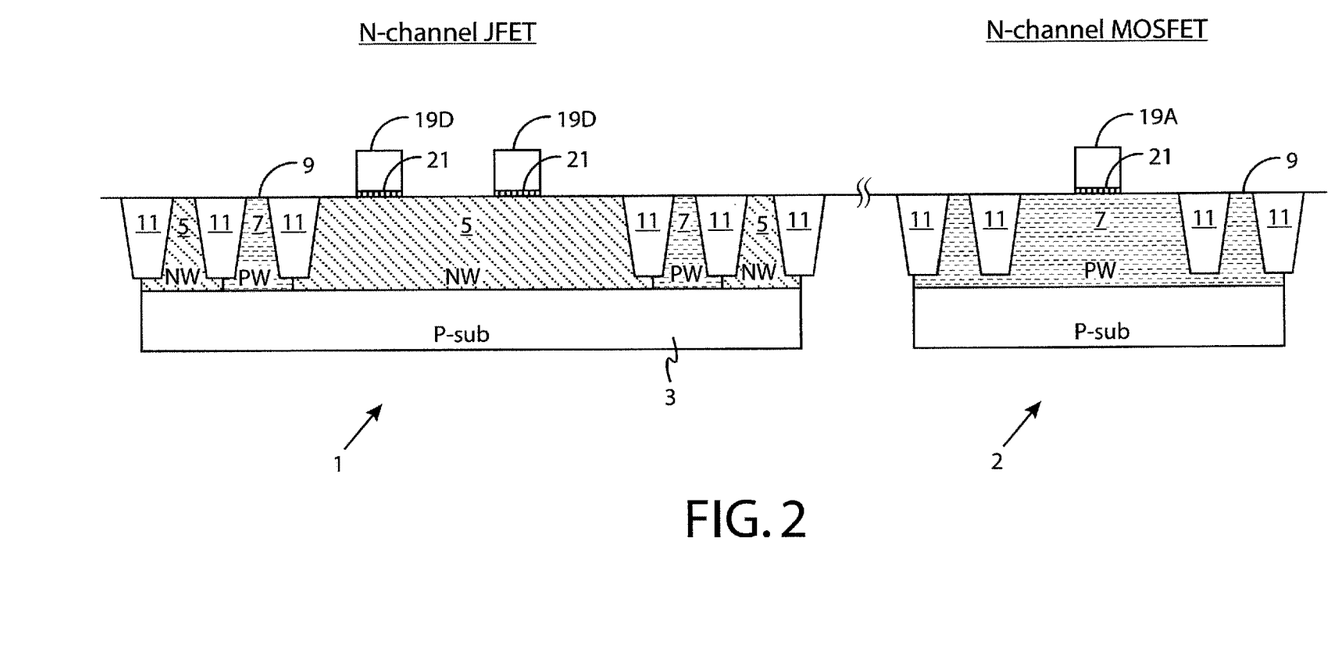

FIG. 2 shows the structures of FIG. 1 after a processing operation has been carried out to form gate electrodes over a gate dielectric. The gate electrodes include dummy gate electrodes 19D in N-channel JFET portion 1 and active gate electrodes 19A in N-channel MOSFET portion 2. Gate dielectric 21 is interposed between the gate electrodes 19D and 19A, and substrate surface 9 and is formed of various suitable dielectric materials and various embodiments. Various photolithographic and etching operations are available and are used to form the structure including gate electrode 19D or 19A and gate dielectric 21 in various embodiments. In one embodiment, gate electrodes 19D and 19A are formed of polycrystalline silicon ("polysilicon") and in other embodiments, other suitable gate electrode materials are used. In N-channel JFET portion 1, gate electrodes 19D serve as dummies, i.e. they are not functional but they are used as masks to accurately establish the spacing between critical JFET device features. Gate electrodes 19A are active gate electrodes that will serve as gate electrodes for operable MOSFET devices.

Because active gate electrodes 19A are formed in N-channel MOSFET portion 2 to serve as transistor gates, and because N-channel JFET portion 1 and N-channel MOSFET portion 2 are formed on the same substrate, no additional processing operations are required to form dummy gate electrodes 19D in N-channel JFET portion 1.

Figure 3:
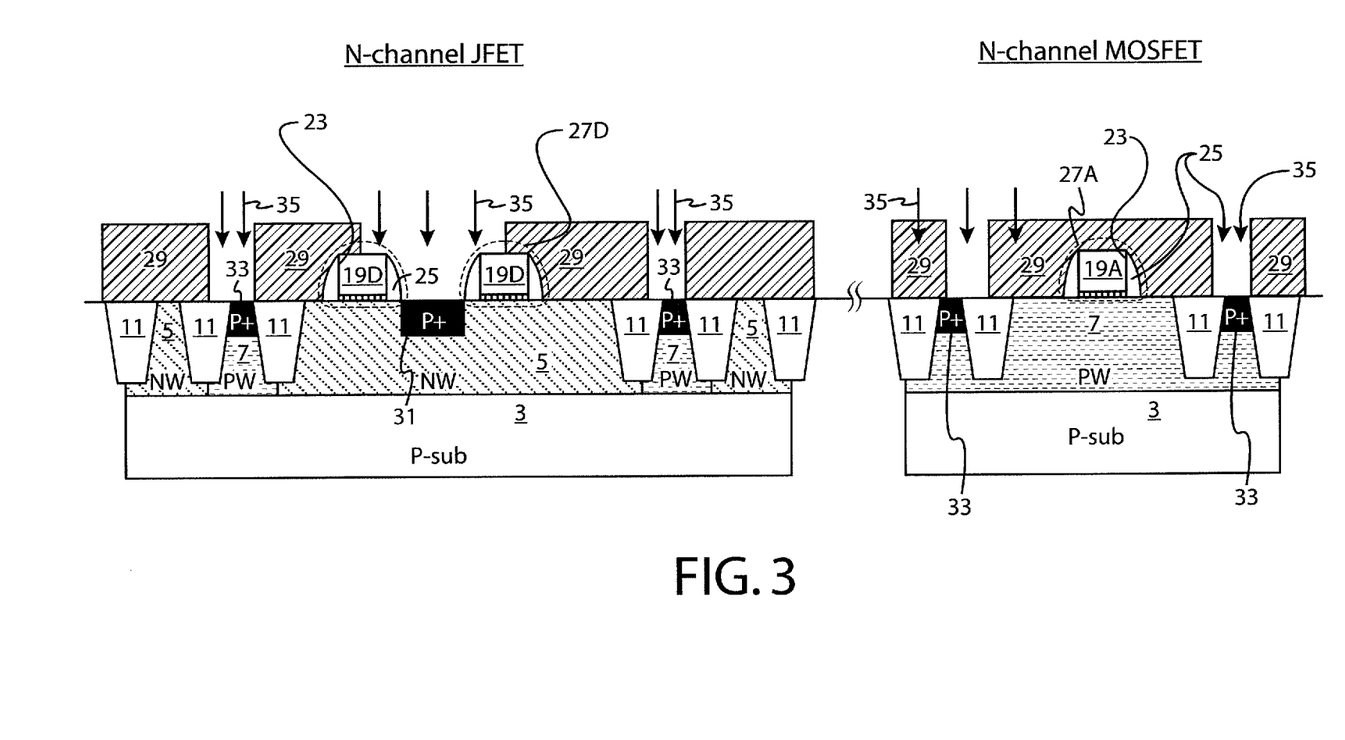

FIG. 3 shows the structures of FIG. 2 after sidewall spacers have been formed along gate electrodes 19D and 19A and a photoresist pattern has been formed as well.

Sidewall spacers 25 are formed along each of opposed sidewalls 23 of active gate electrodes 19A and dummy gate electrodes 19D. Sidewall spacers 25 are formed of oxide, nitride, oxynitride or a composite structure formed of multiple dielectric materials. Various procedures for forming sidewall spacers 25 are used in various embodiments. In one embodiment, a dielectric layer is conformally deposited over the structure shown in FIG. 2 and an anisotropic etching operation is carried out to form sidewall spacers 25. Other methods are used in other embodiments. Dummy gate structures 27D each include a dummy gate electrode 19D, sidewall spacers 25 and gate dielectric 21. Active gate structures 27A each include an active gate electrode 19A, sidewall spacers 25 and gate dielectric 21

FIG. 3 also shows photoresist pattern 29 in both N-channel JFET portion 1 and N-channel MOSFET portion 2. It can be seen that photoresist pattern 29 is formed over portions of dummy gate structure 27D and over active gate structure 27A. In the illustrated embodiment showing the formation of N-channel devices, photoresist pattern 29 along with dummy gate structures 27D and active gate structure 27A serves as a P+ source/drain mask that includes openings through which P+ dopants are introduced. Arrows 35 indicate the dopant impurities being introduced by way of ion implantation or other suitable means for introducing dopant impurities into the substrate. FIG. 3 also shows P+ regions formed within the substrate including P+ gate region 31 and other P+dopant regions 33 as a result of the ion implantation or other suitable means for introducing dopant impurities into the substrate. It can be seen that the location of P+ gate region 31 in N-channel JFET portion 1 is determined and defined by dummy gate structures 27D. P+ gate region 31 is self-aligned with respect to dummy gate structures 27D. Stated alternatively, the position of P+ gate region 31 within N-well 5 is determined by the facing edges of opposed dummy gate structures 27D, and not photoresist pattern 29. The lateral edges of P+ gate region 31 coincide with the lateral edges of dummy gate structures 27D.

Photoresist pattern 29 is removed using various methods in various embodiments. After photoresist pattern 29 is removed, a further photoresist pattern is formed as shown in FIG. 4

Figure 4:
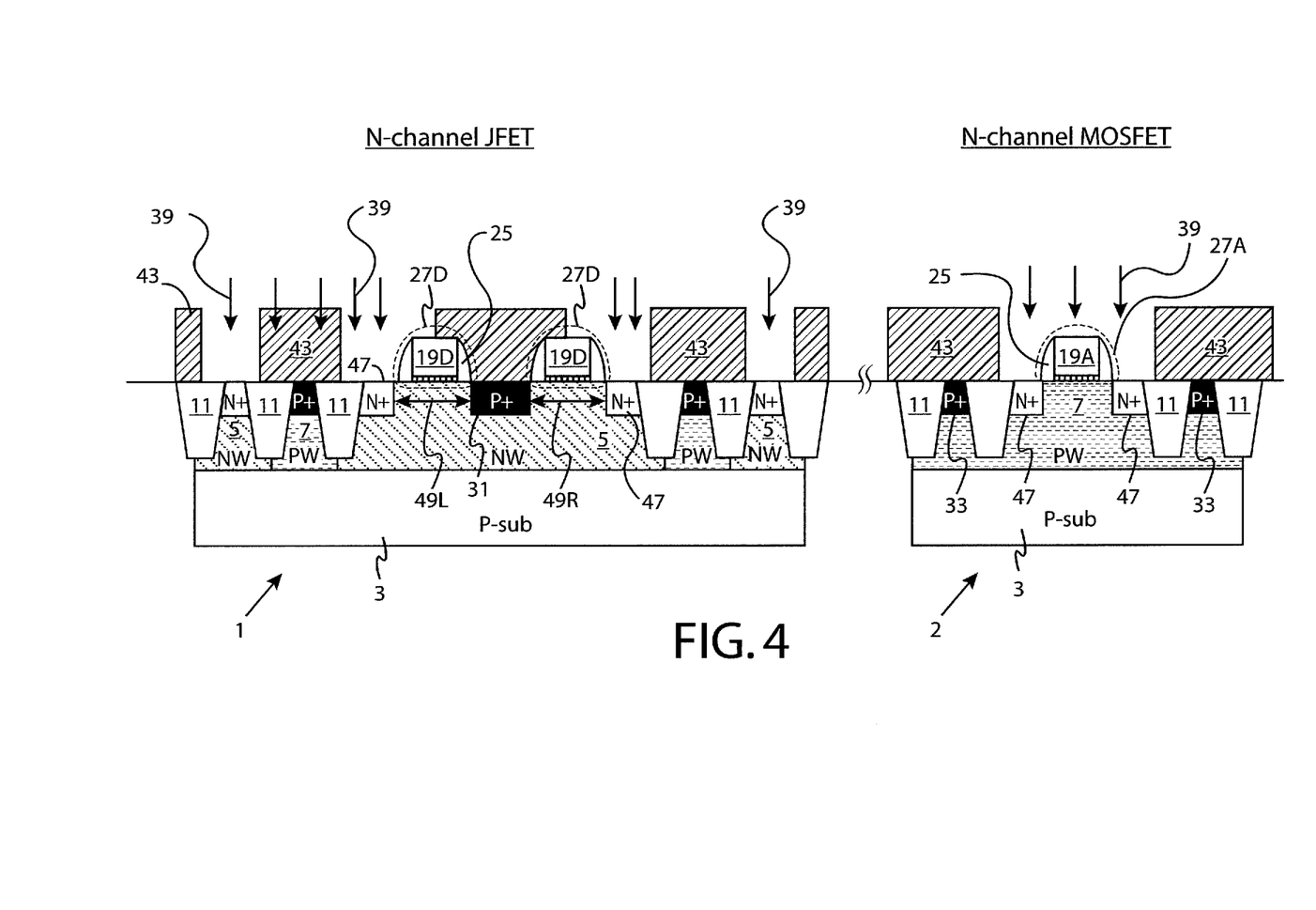

FIG. 4 shows the structures of FIG. 3 after a further photoresist patterning processing operation has been carried out. Photoresist pattern 43 is formed using various photolithographic operations. In the illustrated embodiment of N-channel JFET portion 1 and N-channel MOSFET portion 2, photoresist pattern 43 along with dummy gate structures 27D and active gate structure 27A serves as an N+ source/ drain photoresist pattern and includes openings through which N+ dopants are introduced. Arrows 39 indicate the dopant impurities being introduced by way of ion implantation or other suitable means for introducing dopant impurities into the substrate.

FIG. 4 also shows N+ regions including N+ source/drain regions 47 formed within the substrate as a result of the ion implantation or other suitable means for introducing dopant impurities into the substrate. During the processing operations used to introduce dopant impurities and form both P+gate region 31 and N+ source/drain regions 47, the locations of the impurity regions are determined by dummy gate structures 27D and active gate structures 27A serving as mask features. Both N-channel JFET portion 1 and N-channel MOSFET portion 2 include N+ source/drain regions 47. It can be seen that the placement of N+ source/drain regions 47 in N-channel MOSFET region 2 are self-aligned with respect to the gate, i.e. active gate structure 27A. It can also be seen in N-channel JFET portion 1 that the placement of N+ source/drain regions 47 in N-well 5 is determined and defined by dummy gate structures 27D serving as masks. The edges of N+ source/drain regions 47 are coincident with the edges of dummy gate structure 27D. Referring to N-channel JFET portion 1 in FIG. 4, the transistor channel is the path between the source/drain regions, i.e. the path between the N+ source/drain regions 47 that flank P+ gate region 31. In N-channel JFET portion 1, the spacing between P+ gate region 31 and each N+ source/drain region 47 is determined by the dimensions of dummy gate structure 27D. It can be seen that N+ source/drain region 47 on the left-hand side of P+ gate region 31 is spaced from P+ gate region 31 by length 49L and the N+ source/drain region 47 on the right-hand side of P+ gate region 31 is spaced from P+ gate region 31 by spacing 49R. Each of spacing 49L and 49R is determined by the maximum lateral dimensions of dummy gate structures 27D serving as masks. For example, spacing 49R represents the length of the source/drain-gate gap region on the right-hand side of P+ gate region 31 and is equal to the maximum lateral width of dummy gate structure 27D, which is on substrate surface 9 and occupies the entire region of source/drain-gate gap region. As such, spacing 49L and spacing 49R are each determined by the dimensions of dummy gate structures 27D and not the photoresist pattern.

Figure 5:
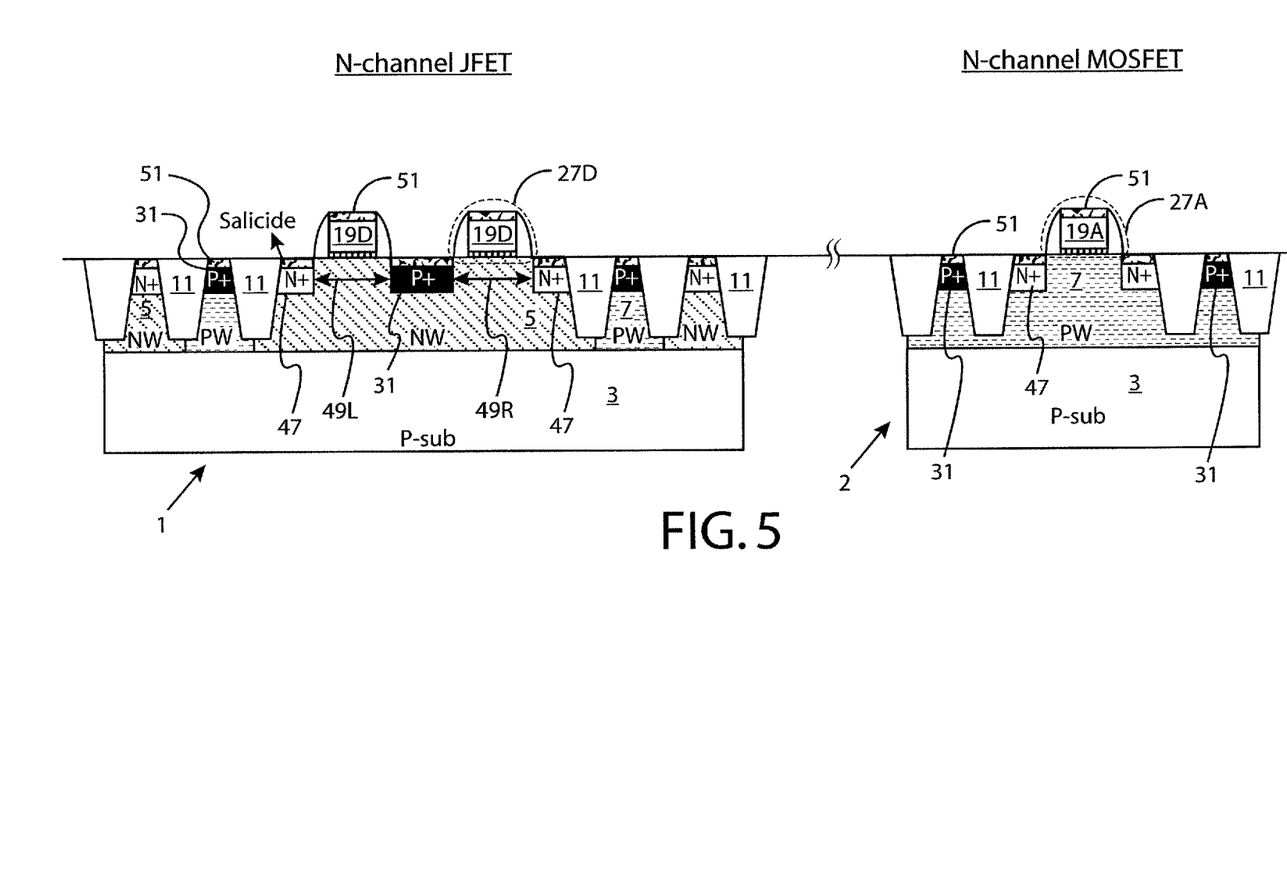

FIG. 5 shows the structure of FIG. 4 after photoresist pattern 43 has been removed and after a silicidation operation has been subsequently carried out. As a result of the silicidation operation, silicide layer 51 is formed on exposed silicon portions according to the embodiment in which P-type substrate 3 is a silicon substrate. Silicide layer 51 is formed over dummy gate electrodes 19D and active gate electrode 19A and the top, exposed portions of P+ gate region 31, P+ dopant regions 33, N+ source/drain regions 47 and other exposed portions of substrate surface 9 such as the other illustrated N+ dopant impurity regions. Platinum and various other suitable metals are used to form silicide layer 51 in various embodiments. Because the location of the silicide layers 51 is self-aligned with respect to dummy gate structures 27D and active gate structure 27A, the silicidation process may be referred to as a salicide ("self-aligned silicide") process.

Spacing 49L represents a source/drain-gate link region and dummy gate structure 27D occupies the entire source/drain/gate-link region. Similarly, spacing 49R represents another source/drain-gate link region and dummy gate structure 27D occupies the entire source/drain-gate link region.

Figure 6:
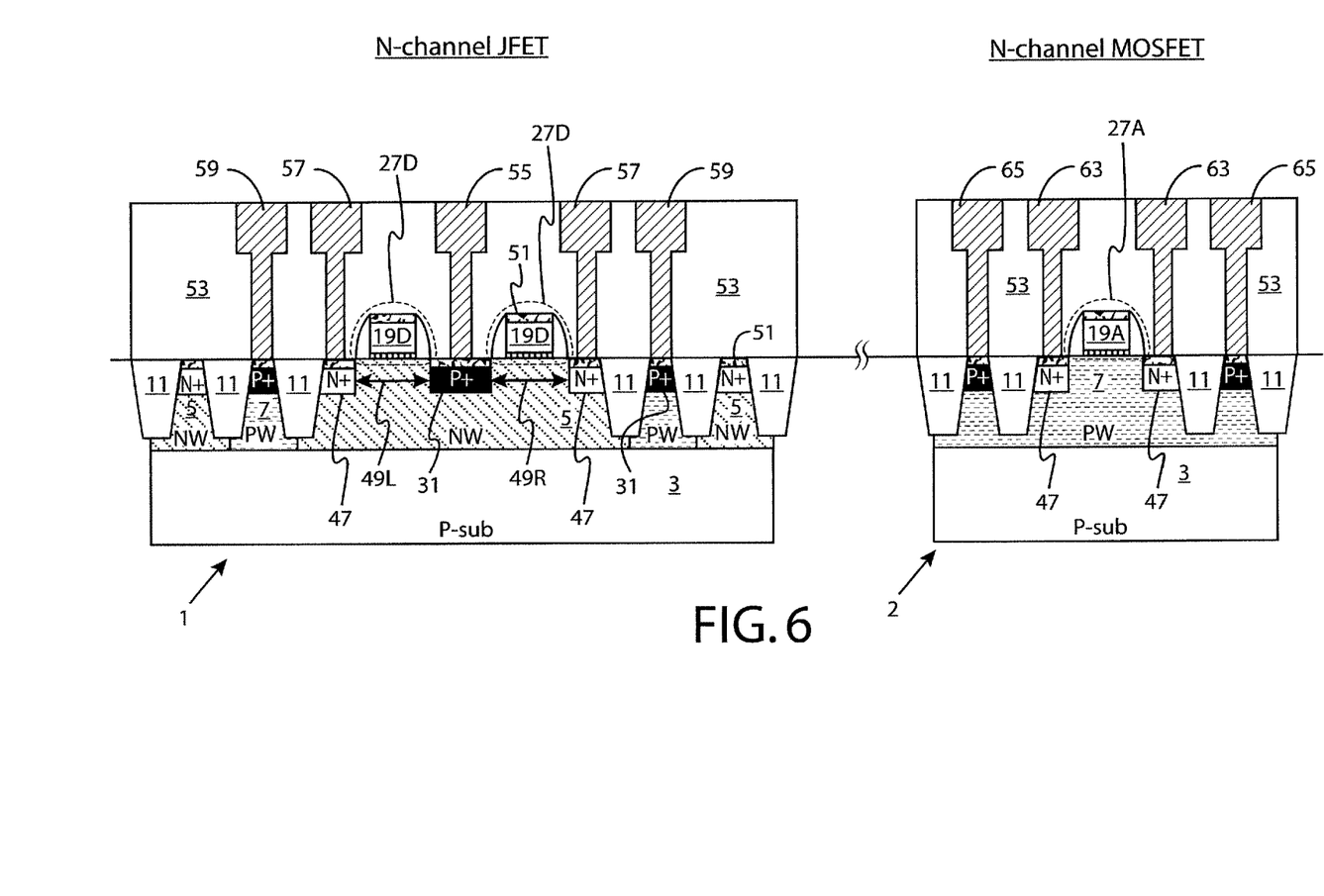

FIG. 6 shows the structures of FIG. 5 after a dielectric and contact structures have been formed. Dielectric 53 is formed over the structures of FIG. 5 and various contact structures are formed through dielectric 53 and down to the subjacent device features. Various methods and suitable materials are used to form dielectric 53 in various embodiments. Referring to N-channel JFET portion 1, gate contact 55 is coupled to P+ gate region 31, source/drain contacts 57 are coupled to N+ source/drain regions 47 and P+ contacts 59 are coupled to P+ dopant regions 33.

In N-channel MOSFET portion 2, the contact to active gate structure 27A is not shown in FIG. 6. Source/drain contacts 63 are coupled to N+ source/drain regions 47 and P+ contacts 65 are coupled to P+ dopant regions 33. Various suitable metals such as copper and aluminum or other suitable conductive materials are used for the various contacts in various embodiments. Various materials are used to form dielectric 53 in various embodiments and the various contact structures are formed using various methods.

The N-channel JFET shown in N-channel JFET portion 1 includes P+ gate region 31 functioning as the transistor gate, and N+ source/drain regions 47 serving as source/drain regions. The transistor channel extends from one N+ source/drain region 47 to the other N+ source/drain region 47. The channel length is the distance between N+ source/drain regions 47 that flank P+ gate region 31 and therefore a function of the spacings 49L and 49R between P+ gate region 31 and the N+ source/drain regions 47, and the width of P+ gate region 31 which was also determined by dummy gate structures 27D serving as masks.

Figure 7:
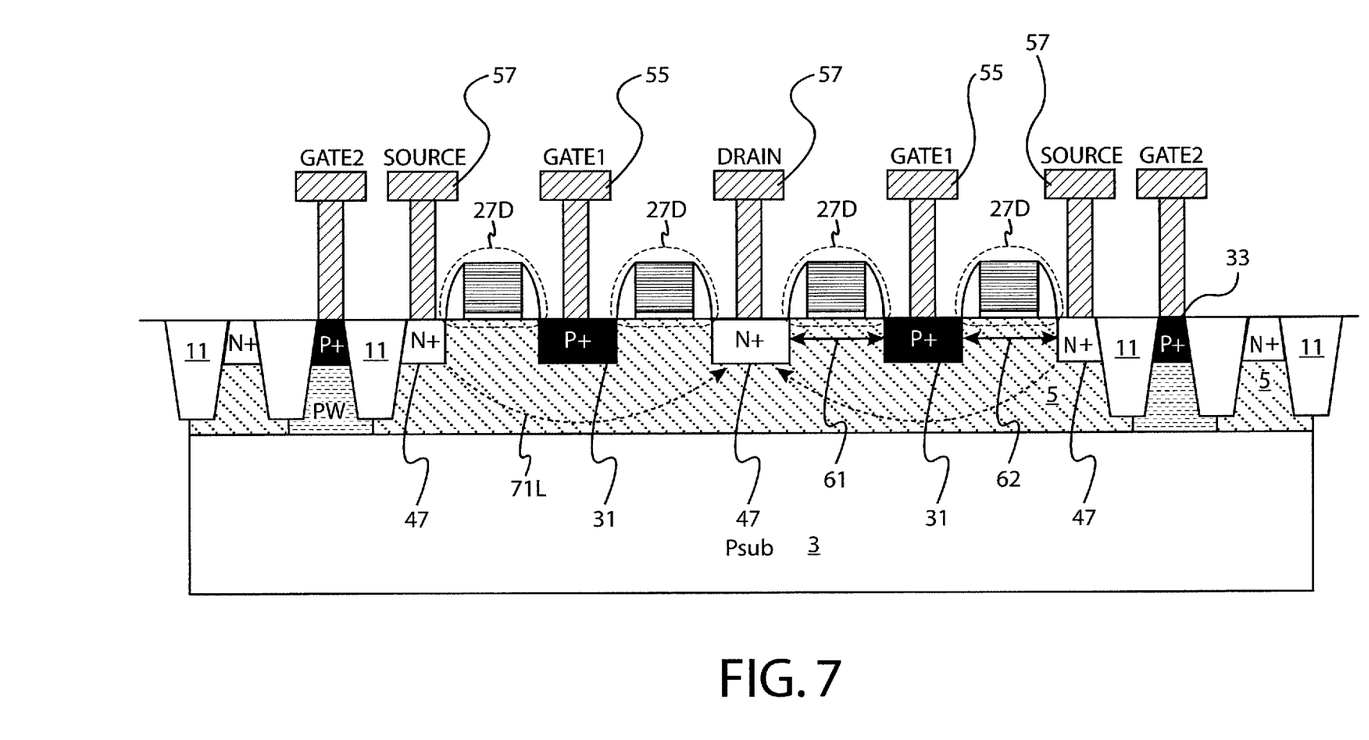
FIG. 7 is a cross-sectional view showing an embodiment of adjacent JFET transistor devices formed according to an embodiment of the disclosure.

FIG. 7 shows two adjacent N-channel JFET devices. Each JFET device includes an associated P+ gate region 31 and two N+ source/drain regions 47 serving as source and drain regions. The two JFET devices share a common drain— centrally located N+ source/drain region 47 with source/drain contact 57 also identified as "Drain" in the illustration of FIG. 7. Each JFET device includes a channel length determined by the spacing between P+ gate region 31 and the two N+ source/drain regions 47 and the width of P+ gate region 31. In the JFET device illustrated on the right-hand side of FIG. 7, the channel length is determined, in part by spacing 61 and spacing 62 between P+ gate region 31 and N+ source/drain regions 47. Each spacing 61 and 62 is determined by and is equivalent to, the width of the associated overlying dummy gate structure 27D on the substrate surface. The two JFET devices that share the common drain structure are also identified by their channels. The JFET device on the left-hand side of FIG. 7 includes channel 71L and the JFET device on the right-hand side of FIG. 7 includes channel 71R.

Figure 8:
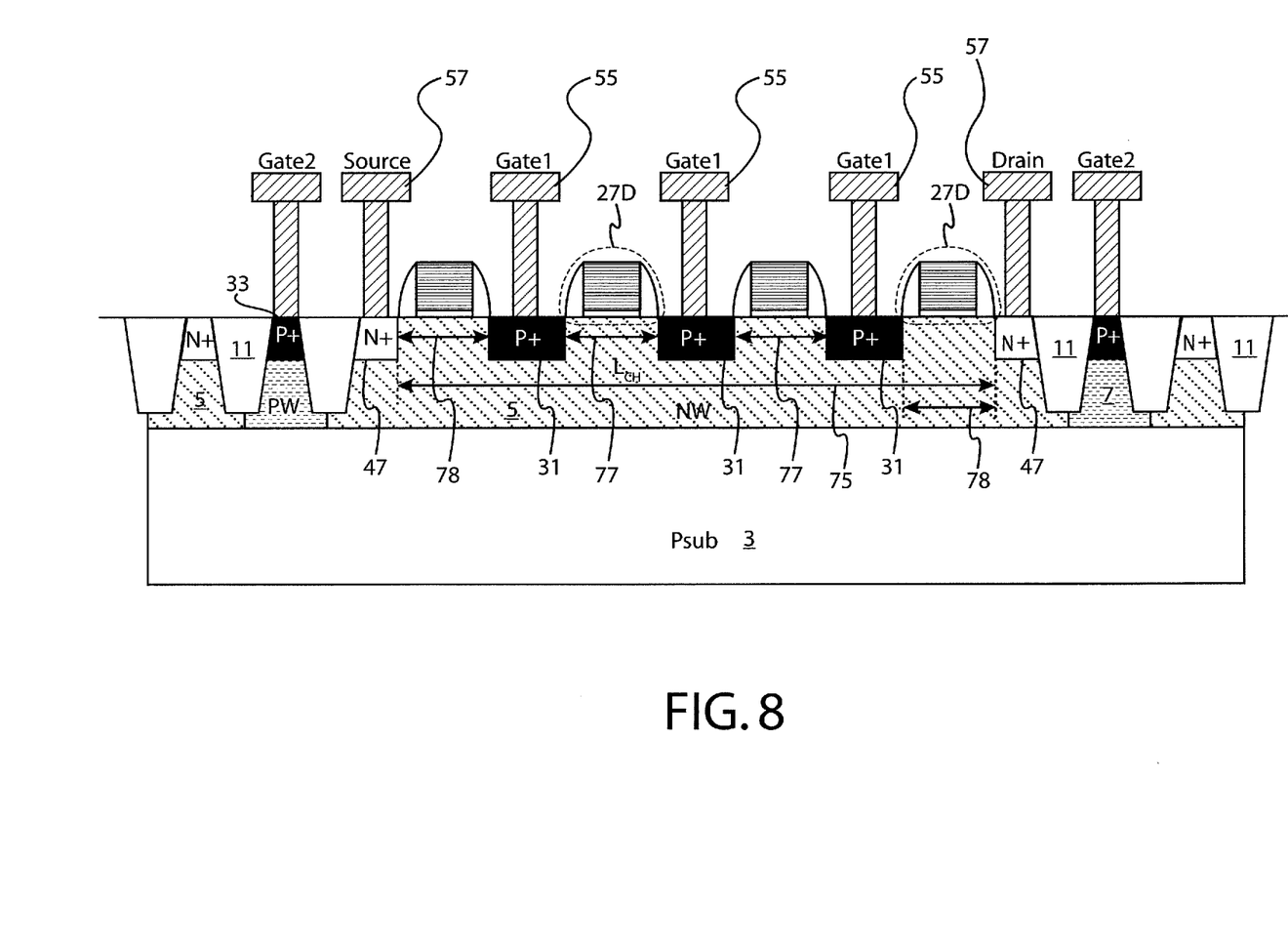
FIG. 8 is a cross-sectional view showing an embodiment of a JFET with multiple gates according to an embodiment of the disclosure.

FIG. 8 shows another aspect of the disclosure and illustrates an embodiment of a JFET structure with a multiple gate arrangement. Each of the three P+ gate regions 31 represents a gate or a portion of a gate including three P+ gate regions 31 and the JFET structure shown in FIG. 8 also includes opposed N+ source/drain regions 47 which serve as source and drain regions. Channel length 75 is the distance between the opposed N+ source/drain regions 47. Each of the P+ gate regions 31 is spaced apart from one another by distance 77 which is equal to the width of the corresponding dummy gate structure 27D. The width of the corresponding dummy gate structure 27D also establishes spacing 78 between the outermost P+ gate region 31 and the adjacent N+ source/drain region 47 serving as a source or drain. In each of FIGS. 7 and 8, dummy gate structures 27C are not active structures.

Figure 9:
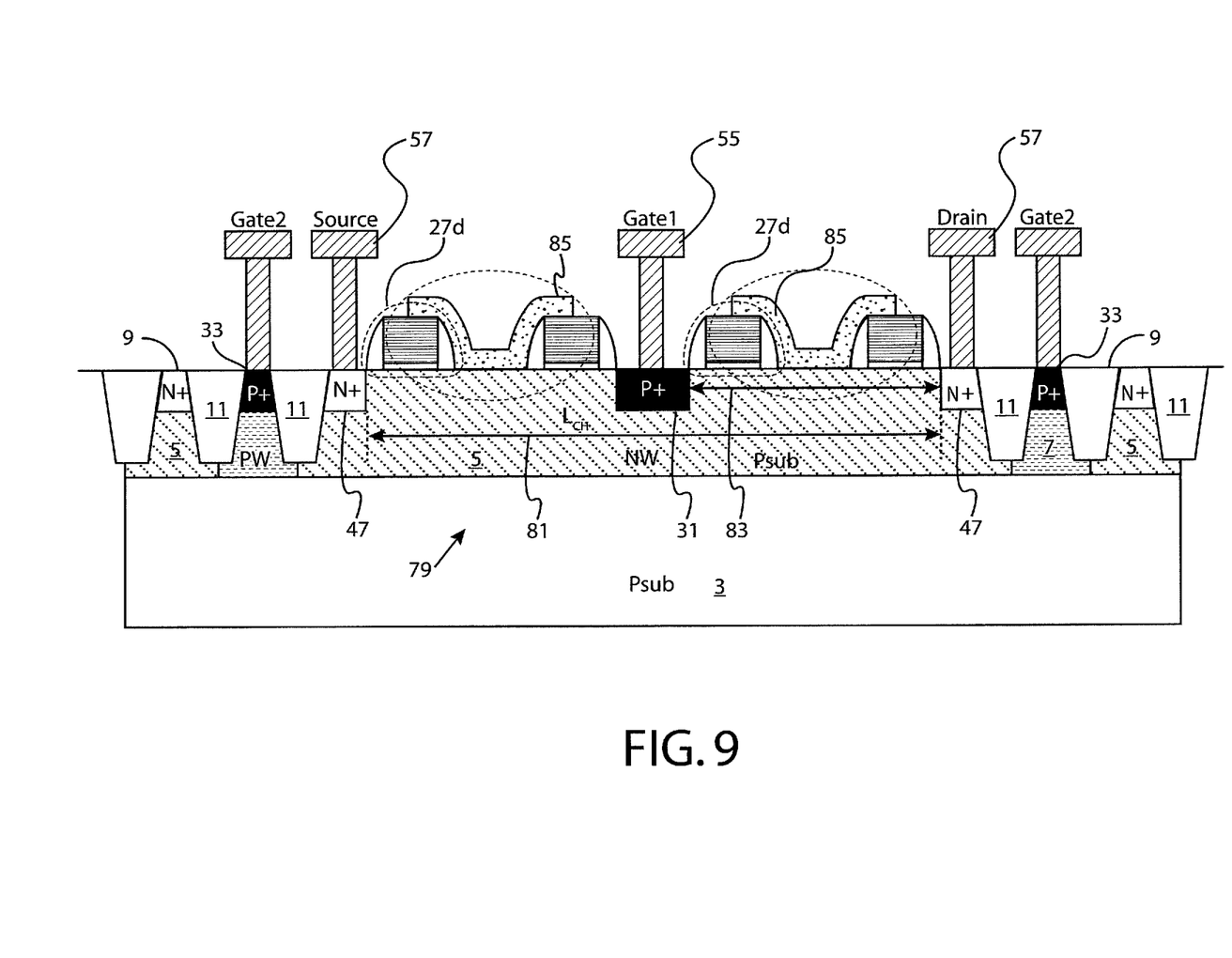
FIG. 9 is a cross-sectional view showing another embodiment of a JFET according to an embodiment of the disclosure.

Now turning to FIG. 9, another embodiment of a JFET device according to an embodiment of the disclosure is shown. JFET structure 79 includes a gate including P+ gate region 31 and gate contact 55. JFET structure 79 includes N+ source/drain regions 47 with source/drain contacts 57. Channel length 81 is determined by spacing 83 between P+ gate region 31 and adjacent N+ source/drain region 47 and the width of P+ gate region 31. In the embodiment of FIG. 9, spacing 83 is determined by two dummy gate structures 27D plus a blocking film 85 that extends between adjacent dummy gate structure 27D and partially over each dummy gate structure 27D. Blocking film 85 is a resist protect oxide, RPO, in one embodiment but other suitable blocking films are used in other embodiments. According to this embodiment, both dummy gate structures 27D and blocking film 85 are in place when the implantation or other dopant impurity introduction operations are used to form P+ gate region 31 and N+ source/drain regions 47. In the embodiment illustrated in FIG. 9, the location of P+ gate region 31 and the two N+ source/drain regions 47, as well as the spacing between these components, is determined by a masking structure made up of dummy gate structure 27D and blocking film 85, i.e. not by a photoresist pattern.

Figure 10:
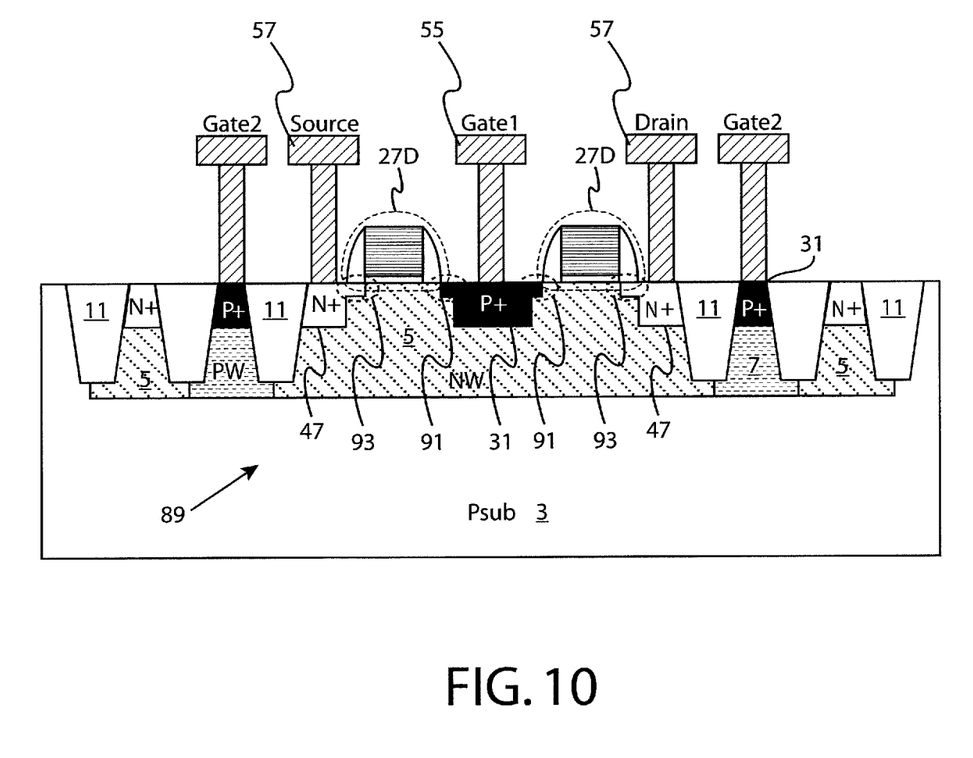
FIG. 10 is a cross-sectional view showing aspects of another embodiment of a JFET according to an embodiment of the disclosure.

FIG. 10 shows an embodiment of JFET device 89 with P+ gate region 31 and two N+ source/drain regions 47 serving as the source and drain regions. The embodiment of FIG. 10 shows dopant extension regions 91 and 93. Dopant extension region 91 is a P+ region extending from P+ gate region 31 and is formed using angled ion implantation or using thermal diffusion operations. Dopant extension region 93 is also formed using angled ion implantation or using thermal diffusion operations and is an N+ region extending from N+ source/drain regions 47. In some embodiments, dopant extension regions 93 are considered LDD, lightly doped drain, regions. Each of dopant extension regions 91 and 93 are formed by first forming the associated dopant region, ie P+ gate region 31 or N+ source/drain region 47 as defined using dummy gate structure 27D as a mask then using angled ion implantation or other thermal diffusion operations to cause encroachment.

In the embodiment of JFET device 89 shown in FIG. 10, the placement and width of P+ gate region 31 and the two N+ source/drain regions 47 are determined by dummy gate structures 27D used as a mask.

According to the various embodiments, various JFET devices are formed using a sequence of processing operations that also simultaneously form MOSFET devices in other portions of the substrate. The JFET devices are characterized by having their gate portions and source/drain portions located and spaced apart by a dummy gate structure serving as a mask The dummy gate structure serving as a mask further provides the width of the P+ gate region.

In other embodiments, P-channel JFET and MOSFET devices are formed using similar techniques as described above but using substrate portions and dopant impurities with different polarities.

In one embodiment, provided is a semiconductor device comprising: a substrate; a JFET transistor comprising a gate region of one polarity disposed in the substrate and source and drain regions of opposite polarity also disposed in the substrate and spaced apart from the gate region, wherein the source region is spaced apart from the gate region in the substrate by a source-gate link region having a length "a" and the drain region is spaced apart from the gate region in the substrate by a drain-gate link region having a length "b;" a dummy gate structure disposed over a surface of the substrate and having a maximum width equal to the width "a;" and a further dummy gate structure disposed over the surface and having a maximum width equal to the width "b".

In one embodiment, width "a" is substantially the same as width "b".

In one embodiment, the dummy gate structure occupies the entire source/gate link region and the further dummy gate dielectric occupies the entire drain/gate link legion and a width of the gate region equals a spacing between the dummy gate structure and the further dummy gate structure.

In one embodiment, the dummy gate structure includes a polysilicon gate electrode.

In one embodiment, the dummy gate structure further includes sidewall spacers along sidewalls of the polysilicon gate electrode.

In one embodiment, the semiconductor device further comprising a silicide on top surfaces of the gate region, the drain region and the source region and on top of a gate electrode portion of the dummy gate structure.

In one embodiment, the gate electrode portion is formed of polysilicon and the dummy gate structure further includes sidewall spacers along sidewalls of the polysilicon gate electrode portion.

In one embodiment, the dummy gate structure comprises a duality of gate electrodes with sidewall spacers, spaced apart from one another by a spacing and wherein the spacing and at least part of each the gate electrode is covered by a blocking film layer, and wherein the further dummy gate structure comprises a duality of further gate electrodes with sidewall spacers, spaced apart from one another by a further spacing and wherein the further spacing and at least part of each the further gate electrodes is covered by the blocking film layer In one embodiment, provided is a semiconductor device comprising: a substrate; a JFET transistor comprising at least one gate region of a first polarity disposed in the substrate and source and drain regions of a second polarity also disposed in the substrate and spaced apart from the at least one gate region, wherein the source region is spaced apart from the at least one gate region in the substrate by a source-gate link region and the drain region is spaced apart from the at least one gate region in the substrate by a drain-gate link region; at least one dummy gate structure disposed over a surface of the substrate and having opposed ends extending from an edge of the drain region to an edge of the at least one gate region; and at least one further dummy gate structure disposed over the surface and having opposed ends extending from an edge of the source region to an edge of the at least one gate region.

In one embodiment, each dummy gate structure comprises a polysilicon gate electrode with sidewall spacers and the at least one dummy gate structure comprises a plurality of dummy gate structures with an oxide extending between the dummy gate structures and over a top of the dummy gate structures.

In one embodiment, the at least one gate region comprises a plurality of discrete gate regions formed in the substrate, and wherein adjacent gate regions of the plurality of discrete gate regions are spaced apart by a gate—gate link region and wherein a further dummy gate structure is disposed over the surface and includes a maximum width equal to a width of the gate-gate link region.

In one embodiment, provided is a method for forming a semiconductor device. The method comprises forming a dopant region of a first polarity in a substrate; forming at least a duality of dummy gate structures over the dopant region, each the dummy gate structure including a gate electrode with opposed sidewall spacers; using the dummy gate structures as masks and introducing dopant impurities of a second polarity into the dopant region between at least two of the duality of dummy gate structures thereby forming at least a gate structure in the substrate, each gate structure having a width equal to the spacing between the duality of dummy gate structures; using the dummy gate structures as a mask and introducing dopant impurities of the first polarity into the dopant region in areas laterally outside and immediately adjacent the gate structures thereby forming a duality of source/drain regions in the substrate; and forming a JFET by forming contacts to the gate structure and the source/drain regions.

In one embodiment, each gate electrode comprises polysilicon.

In one embodiment, the method further comprising forming active gate structures simultaneously with the forming at least a duality of dummy gate structures, each active gate structure including an active gate electrode with opposed sidewall spacers and further comprising using the active gate structure as a mask and forming self-aligned source/drain structures of a MOSFET (metal oxide semiconductor field effect transistor) structure utilizing the active gate structure as a transistor electrode.

In one embodiment, the forming self-aligned source/drain structures of a MOSFET comprises introducing source/drain impurities into the substrate using ion implantation.

In one embodiment, the introducing dopant impurities of a second polarity and the introducing dopant impurities of the first polarity each comprise ion implantation.

In one embodiment, the method further comprises forming a photoresist mask and wherein the introducing dopant impurities of a second polarity further comprises using the photoresist mask to cover further portions of the semiconductor device.

In one embodiment, the method further comprises forming a photoresist mask and wherein the introducing dopant impurities of the first polarity further comprises using the photoresist mask to cover further portions of the semiconductor device.

In one embodiment, each source/drain region is spaced from one the gate structure by a distance equivalent to a maximum width of a corresponding dummy gate structure disposed over the substrate between the source/drain region and the one the gate structure.

In one embodiment, the forming at least a duality of dummy gate structures comprises forming a plurality of the dummy gate structures over the dopant region, the using the plurality of dummy gate structures as masks and introducing the dopant impurities of the second polarity into the dopant region between the plurality of dummy gate structures thereby forms a plurality of the gate structures, and the method further comprises forming a hard mask film extending from and at least partially covering adjacent dummy gate structures of the plurality of gate structures prior to the introducing dopant impurities of the first polarity into the dopant region.

The preceding merely illustrates the principles of the disclosure. It will thus be appreciated that those of ordinary skill in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid the reader in understanding the principles of the disclosure and the concepts contributed by the inventors to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of exemplary embodiments, it is not limited thereto. Rather, the appended claims should be construed broadly, to include other variants and embodiments of the disclosure, which may be made by those of ordinary skill in the art without departing from the scope and range of equivalents of the disclosure.

What is claimed is:

1. A semiconductor device comprising:
   a substrate;
   a first pair of dummy gate structures disposed over a surface of the substrate;
   a second pair of dummy gate structures disposed over the surface of the substrate, wherein the second pair of dummy gate structures is laterally spaced apart from the first pair of dummy gate structures;
   a first gate region of a first polarity, wherein the first gate region is disposed in the substrate and between the first pair of dummy gate structures;
   a second gate region of the first polarity, wherein the second gate region is disposed in the substrate and between the second pair of dummy gate structures;
   a first source/drain region of a second polarity, wherein the first source/drain region is disposed in the substrate, and laterally outside the first and second gate regions and immediately adjacent to one of the first pair of dummy gate structures;
   a second source/drain region of the second polarity, wherein the second source/drain region is disposed in the substrate, and laterally outside the first and second gate regions and immediately adjacent to one of the second pair of dummy gate structures; and
   a third source/drain region of the second polarity, wherein the third source/drain region is disposed in the substrate, and laterally between the first and second pairs of dummy gate structures.

2. The semiconductor device of claim 1, wherein the first and second pairs of dummy gate structures each comprises a conductive dummy gate electrode formed over a dummy gate dielectric.

3. The semiconductor device of claim 2, wherein the conductive dummy gate electrode comprises a polysilicon.

4. The semiconductor device of claim 2, wherein the first and second pairs of dummy gate structures each further comprises sidewall spacers along sidewalls of the respective conductive dummy gate electrode.

5. The semiconductor device of claim 1, wherein each of the first and second gate regions is laterally spaced apart from the third source/drain region by a first link region in the substrate that has a first length.

6. The semiconductor device of claim 5, wherein the first and second source/drain regions are laterally spaced apart from the first and second gate regions, respectively, by a second link region in the substrate that has a second length.

7. The semiconductor device of claim 6, wherein a maximum width of one of the first or second pair of dummy gate structures is equal to the first length, and a maximum width of the other of the first or second pair of dummy gate structures is equal to the second length.

8. The semiconductor device of claim 6, wherein the first length is substantially the same as the second length.

9. A semiconductor device comprising;
   a substrate;
   a first pair of dummy gate structures disposed over a surface of the substrate;
   a second pair of dummy gate structures disposed over the surface of the substrate, wherein the second pair of dummy gate structures is laterally spaced apart from the first pair of dummy gate structures;
   a first doped region of a first conductivity type, wherein the first doped region forming a gate region of a first junction-field-effect-transistor (JFET) is disposed in the substrate and between the first pair of dummy gate structures;
   a second doped region of the first conductivity type, wherein the second doped region forming a gate region of a second JFET is disposed in the substrate and between the second pair of dummy gate structures;
   a third doped region of a second conductivity type, wherein the third doped region forming a source region of the first JFET is disposed in the substrate, and laterally outside the first and second doped regions and immediately adjacent to one of the first pair of dummy gate structures;
   a fourth region of the second conductivity type, wherein the fourth region forming a source region of the first JFET is disposed in the substrate, and laterally outside the first and second doped regions and immediately adjacent to one of the second pair of dummy gate structures; and
   a fifth doped region of the second conductivity type, wherein the fifth region is disposed in the substrate, and laterally between the other of the first pair of dummy gate structures and the other of the second pair of dummy gate structures, wherein the fifth doped region forms a drain region shared by the first and second JFETs.

10. The semiconductor device of claim 9, wherein the first and second pairs of dummy gate structures each comprises a conductive dummy gate electrode formed over a dummy gate dielectric.

11. The semiconductor device of claim 10, wherein the conductive dummy gate electrode comprises a polysilicon.

12. The semiconductor device of claim 10, wherein the first and second pairs of dummy gate structures each further comprises sidewall spacers along sidewalls of the respective conductive dummy gate electrode.

13. The semiconductor device of claim 9, wherein each of the first and second doped regions is laterally spaced apart from the third doped region by a first link region in the substrate having a first length.

14. The semiconductor device of claim 13, wherein the first and second doped regions are laterally spaced apart from the first and second doped regions, respectively, by a second link region in the substrate having a second length.

15. The semiconductor device of claim 13, wherein a maximum width of one of the first or second pair of dummy gate structures is equal to the first length, and a maximum width of the other of the first or second pair of dummy gate structures is equal to the second length.

16. The semiconductor device of claim 13, wherein the first length is substantially the same as the second length.

17. A semiconductor device comprising:
a substrate; and
a pair of junction-field-effect-transistors (JFETs) that are laterally adjacent to each other and share a common source/drain region disposed in the substrate, wherein each of the pair of JFETs comprises:
a pair of dummy gate structures disposed above a surface of the substrate;
a gate region of a first polarity disposed in the substrate and between the pair of dummy gate structures;
a source/drain region of a second polarity, wherein the source/drain region is disposed in the substrate, and laterally outside the gate region and immediately adjacent to one of the pair of dummy gate structures; and
the common source/drain region of the second polarity, wherein the common source/drain region is disposed laterally inside the gate region and immediately adjacent to the other of the pair of dummy gate structures.

18. The semiconductor device of claim 17, wherein the pair of dummy gate structures each comprises a conductive dummy gate electrode formed over a dummy gate dielectric.

19. The semiconductor device of claim 17, wherein the gate region is laterally spaced apart from the source/drain region by a first link region in the substrate having a first length, and from the common source/drain region by a second link region in the substrate having a second length.

20. The semiconductor device of claim 19, wherein a maximum width of one of the pair of dummy gate structures is equal to the first length, and a maximum width of the other of the pair of dummy gate structures is equal to the second length.

* * * * *